United States Patent
Park

(10) Patent No.: US 9,880,543 B2
(45) Date of Patent: Jan. 30, 2018

(54) METHOD FOR TRANSFERRING DATA BETWEEN MPU AND MEMORY IN A PLC USING ACCESS SIGNAL BUFFER AND INPUT BUFFER CONTROLLED IN RESPONSE TO AN ADDRESS SIGNAL

(71) Applicant: LSIS CO., LTD., Anyang-si, Gyeonggi-do (KR)

(72) Inventor: Jo Dong Park, Cheonan-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 14/866,649

(22) Filed: Sep. 25, 2015

(65) Prior Publication Data

US 2016/0103440 A1    Apr. 14, 2016

(30) Foreign Application Priority Data

Oct. 13, 2014  (KR) .................. 10-2014-0137572

(51) Int. Cl.
G05B 19/05    (2006.01)
G11C 7/10     (2006.01)

(52) U.S. Cl.
CPC .............. *G05B 19/05* (2013.01); *G11C 7/10* (2013.01); *G11C 7/1057* (2013.01); *G11C 7/1084* (2013.01); *G11C 7/1063* (2013.01)

(58) Field of Classification Search
CPC ....... G11C 7/10; G11C 7/1051; G11C 7/1057; G11C 7/1063; G11C 7/1084; G05B 19/05
See application file for complete search history.

(56) References Cited

U.S. PATENT DOCUMENTS

| 6,308,244 B1* | 10/2001 | Katayama | G11C 29/74 365/230.03 |
| 6,604,228 B1* | 8/2003 | Patel | H03K 19/0027 257/299 |
| 2013/0066441 A1* | 3/2013 | Park | G05B 19/05 700/11 |
| 2014/0139263 A1* | 5/2014 | Park | H03K 19/00392 326/38 |

* cited by examiner

*Primary Examiner* — Sanjiv Shah
*Assistant Examiner* — Glenn Gossage
(74) *Attorney, Agent, or Firm* — K&L Gates, LLP

(57) ABSTRACT

A method for transmitting and receiving data between a micro processing unit (MPU) and a memory operating with different operating voltages in a programmable logic controller (PLC) is provided. In one embodiment, the method includes outputting, by the MPU, a chip select (CS) signal and an address signal to read requested data from the memory, outputting, by an OR gate, an activation signal for activating a data input buffer, the OR gate receiving the CS signal and the address signal, and outputting, by an access signal output buffer, a memory access signal for operation of the memory, the access signal output buffer receiving the CS signal and the address signal. The method further includes outputting the requested data to the data input buffer, and outputting, by the data input buffer, the requested data to the MPU when the requested data is received by the data input buffer from the memory.

6 Claims, 7 Drawing Sheets

METHOD FOR TRANSFERRING DATA BETWEEN MPU AND MEMORY IN A PLC USING ACCESS SIGNAL BUFFER AND INPUT BUFFER CONTROLLED IN RESPONSE TO AN ADDRESS SIGNAL

CROSS-REFERENCE TO RELATED APPLICATION

Pursuant to 35 U.S.C. § 119(a), this application claims the benefit of the earlier filing date and right of priority to Korean Patent Application No. 10-2014-0137572, filed on Oct. 13, 2014, the contents of which are all hereby incorporated by reference herein in its entirety.

BACKGROUND OF THE DISCLOSURE

Field

The teachings in accordance with the exemplary embodiments of this present disclosure generally relate to a method for transmitting and receiving data between a micro processing unit (MPU) and a memory that operate with mutually different operating voltages in a programmable logic controller (PLC).

Background

Concomitant with requirement of high speed operation for semiconductor devices such as MPUs, memory devices, and logic integrated circuits (ICs), an operating frequency is also required to increase whereby power consumption is also increased. This increased power consumption can result in heated ICs and energy waste which may hinder speedy transmission and receipt of data and realization of low operating voltages.

Meantime, voltage levels of ICs used in PLCs (Programmable Logic Controllers) widely used for controlling automation facilities at industrial sites are 1.2V, 3.3V and 5V, which means that operating voltages are different, such that methods for transmitting and receiving data between devices have surfaced as new issues.

In general, the PLC exchanges data with memory devices, communication controllers and expansion modules based on the MPU. Transmission and receipt of data among devices having different operating voltages have conventionally used a unidirectional communication method based on the MPU.

FIG. 1 illustrates a data flow based on unidirectional communication among devices each having a different operating voltage in a PLC according to the prior art.

Referring to FIG. 1, an operating voltage of an MPU (1) is 3.3V, and an operating voltage of an input sensor (2) and an output driver (3) is 5V, so that the operating voltage of the input sensor (2) and the output driver (3) is different from that of the MPU (1).

At this time, the MPU (1) may receive data outputted from the input sensor (2), and transmit the data to be output to the output driver (3). Meanwhile, the input sensor (2) may simply transmit data to the MPU (1), but receive no data from the MPU (1), and the output driver (3) may simply receive the data from the MPU (1), but transmit no data to the MPU (1). Thus, the MPU (1) may perform bidirectional communication that receives and transmits data, while the input sensor (2) and the output driver (3) perform unidirectional communication.

Meanwhile, an input buffer (4) may be interposed between the input sensor (2) and the MPU (1), and an output buffer (5) may be interposed between the MPU (1) and the output driver (3), because operating voltages of the input sensor (2) and the output driver (3) are dissimilar to the operating voltage of MPU (1).

At this time, the input buffer (4) may convert 5V data transmitted from the input sensor (2) to 3.3V data recognizable by the MPU (1) and transmit the converted 3.3 V data to the MPU (1), and the output buffer (5) may convert 3.3V data transmitted from the MPU (1) to 5V data recognizable by the output driver (3) and transmit the converted 5V data to the output driver (3).

An OR gate (6) may be interposed between the MPU (1) and the input buffer (4) to output an enable signal (IN_CS) to the input buffer (4) by receiving a CS (Chip Select) signal and a RD (READ) signal outputted from the MPU (1). Furthermore, an OR gate (7) may be interposed between the MPU (1) and the output buffer (5) to output an enable signal (OUT_CS) to the output buffer (5) by receiving a CS (Chip Select) signal and a WR (WRITE) signal outputted from the MPU (1).

FIG. 2 is a timing diagram illustrating that the MPU (1) receives data from the input sensor (2), and FIG. 3 is a timing diagram illustrating that the MPU (1) transmits data to the output driver (3).

Because the input sensor (2) and the output driver (3) perform unidirectional communication, a time delay resultant from each configuration is generated, as illustrated in FIGS. 2 and 3, where the MPU (1) may normally receive data from the input sensor (2) and may transmit data to the output driver (3).

As noted from the foregoing, the data transmission and reception between devices of different operating voltages were performed using the unidirectional communication method based on an MPU according to the prior art. Thus, a device performing read/write operations such as a memory must be operated using the same operating voltage as that of the MPU. However, disadvantages have occurred in cases where one memory is shared by multiple MPUs having different operating voltages, as the multiple MPUs are used to execute different functions such as basic operation, communication, and position control for performance enhancement.

When one memory is shared by multiple MPUs having different operating voltages as noted above, a problem occurs where an MPU having a different operating voltage from that of a memory cannot have a smooth transmission/reception of data with the memory, although another MPU having a same operating voltage as that of the memory can normally perform the transmission/reception of data with the memory.

SUMMARY

The present disclosure has been made to solve the foregoing disadvantages/problems of the prior art and therefore an object of certain embodiments of the present disclosure is to provide a method for transmitting and receiving data between an MPU and a memory that operate with different operating voltages in a PLC.

Technical problems to be solved by the present disclosure are not restricted to the above-mentioned description, and any other technical problems not mentioned so far will be clearly appreciated from the following description by those skilled in the art.

The present disclosure is to solve at least one or more of the above problems and/or disadvantages in whole or in part and to provide at least advantages described hereinafter. In order to achieve at least the above objects, in whole or in part, and in accordance with the purposes of the present disclosure, as embodied and broadly described, and in one general aspect of the present invention, there is provided a method for transmitting and receiving data between an MPU and a memory operating with different operating voltages in a PLC, wherein the method comprises outputting, by the MPU, a chip select (CS) signal and an address signal to read requested data from the memory; outputting, by an OR gate, an activation signal for activating a data input buffer, the OR gate receiving the CS signal and the address signal output by the MPU; and outputting, by an access signal output buffer, a memory access signal for operation of the memory, the access signal output buffer receiving the CS signal and the address signal output by the MPU. The method further comprises outputting, by the memory, the requested data to the data input buffer in response to the memory access signal; and outputting, by the data input buffer, the requested data to the MPU when the requested data is received by the data input buffer from the memory.

Preferably, but not necessarily, outputting the memory access signal may include outputting, by the access signal output buffer, the memory access signal by converting the CS signal and the address signal received from the MPU to a voltage level recognizable by the memory.

Preferably, but not necessarily, outputting the requested data to the MPU may include outputting the data received by the data input buffer to the MPU by converting to a voltage level recognizable by the MPU.

Preferably, but not necessarily, the address signal may be level shifted at the same time as the CS signal.

Preferably, but not necessarily, the CS signal and the address signal may maintain a level "LOW" to enable the OR gate to output the activation signal while the requested data is being output to the data input buffer by the memory and the requested data is being output to the MPU by the data input buffer.

Preferably, but not necessarily, an uppermost bit of the address signal sets a read area and a write area of the memory configured by dividing a memory area in half.

The method for transmitting and receiving data between an MPU and a memory in a PLC according to the exemplary embodiments of the present disclosure has an advantageous effect in that data outputted from a memory can be read by an MPU without any loss by using a 1-bit address as an input of an OR gate configured to output an activation signal for activating a data input buffer, whereby data transmission/reception can be made possible without data loss between the MPU and the memory that operate with mutually different operating voltages in a PLC, and data transmission/reception can be made possible without data loss even if the number of devices, each having a different operating voltage, is increased.

BRIEF DESCRIPTION OF THE DRAWINGS

The accompanying drawings included to provide a further understanding of the disclosure and incorporated in and constituted as a part of this application, illustrate embodiment(s) of the disclosure, and together with the description, serve to explain the principle of the disclosure. In the drawings.

DETAILED DESCRIPTION

Figure 1:
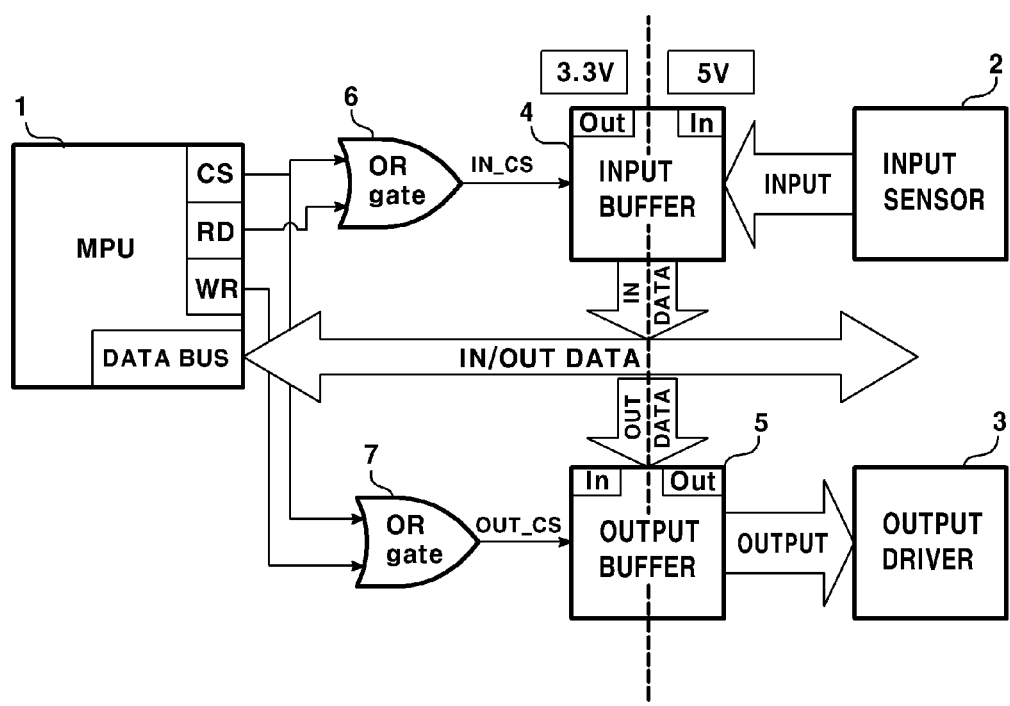
FIG. 1 illustrates a data flow based on unidirectional communication among devices each having a different operating voltage in a PLC according to a prior art.
Figure 2:
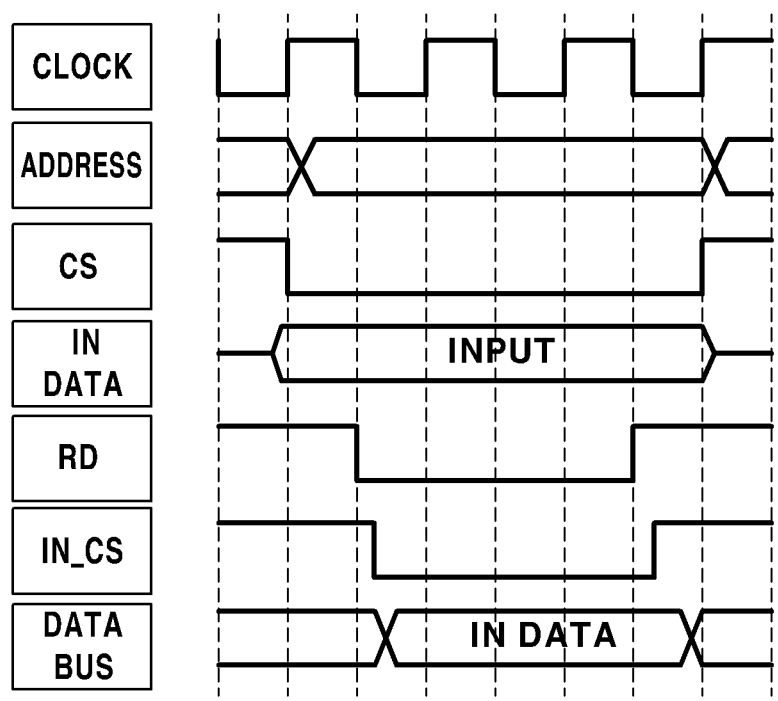
FIG. 2 is a timing diagram illustrating that an MPU receives data from an input sensor according to a prior art.
Figure 3:
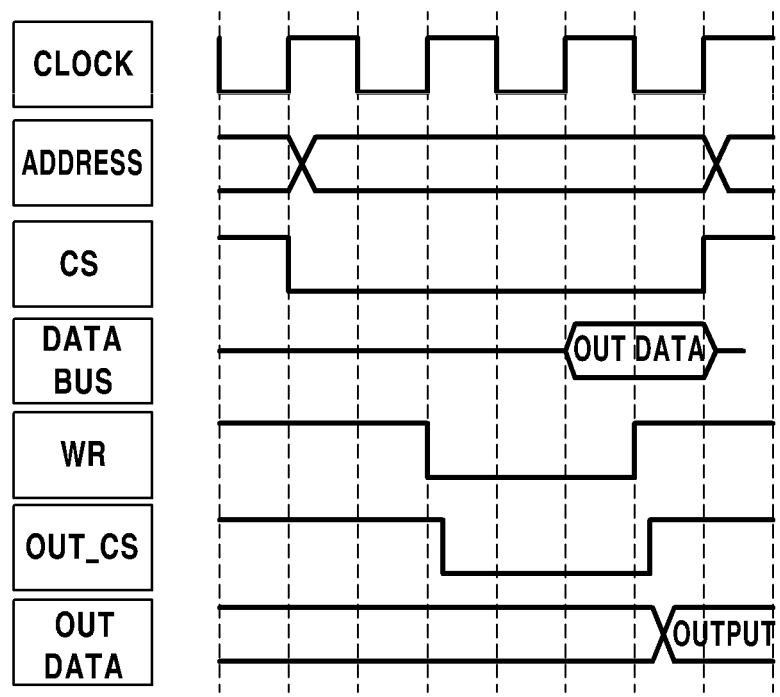
FIG. 3 is a timing diagram illustrating that an MPU transmits data to an output driver according to a prior art.

Various exemplary embodiments will be described more fully hereinafter with reference to the accompanying drawings, in which some exemplary embodiments are shown.

Advantages and features of the present disclosure may be understood more readily by reference to the following detailed description of exemplary embodiments and the accompanying drawings. However, the present disclosure is not limited to the exemplary embodiments which will be described below, but may be implemented in other forms.

The particular embodiments disclosed herein are illustrative only, as the invention may be modified and practiced in different but equivalent manners apparent to those skilled in the art having the benefit of the teachings herein. The present disclosure may be embodied in many different forms and should not be construed as limited to the embodiments set forth herein. Rather, these embodiments are provided so that this disclosure will be thorough and complete, and will fully convey the scope and principle of the general inventive concept to those skilled in the art. Furthermore, throughout the descriptions, the same reference numerals will be assigned to the same elements in the explanations of the figures, and explanations that duplicate one another will be omitted.

Detailed descriptions of well-known functions, configurations or constructions are omitted for brevity and clarity so as not to obscure the description of the present disclosure with unnecessary detail. Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

The conventional technology is configured in a manner such that an input port and an output port are designed to control different devices, and therefore the conventional technology is not suitable for devices that must perform a read and write at the same time with a memory.

Figure 4:
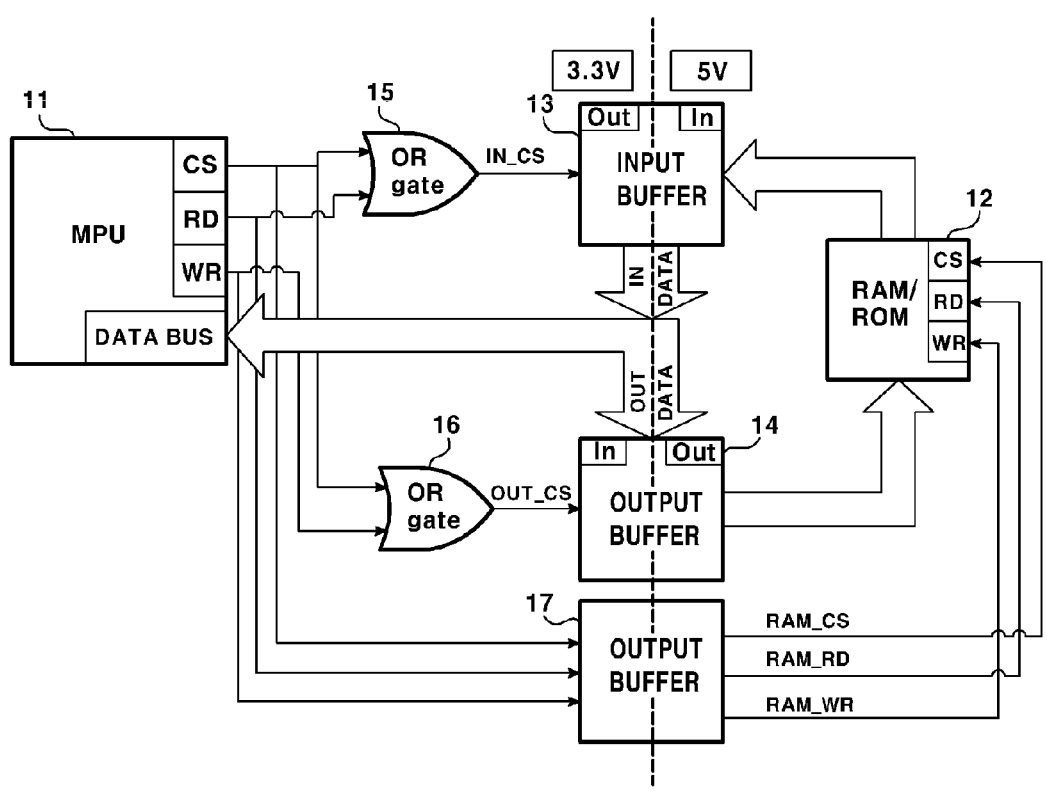
FIG. 4 is a data flowchart during memory read using a level shifter.
Figure 5:
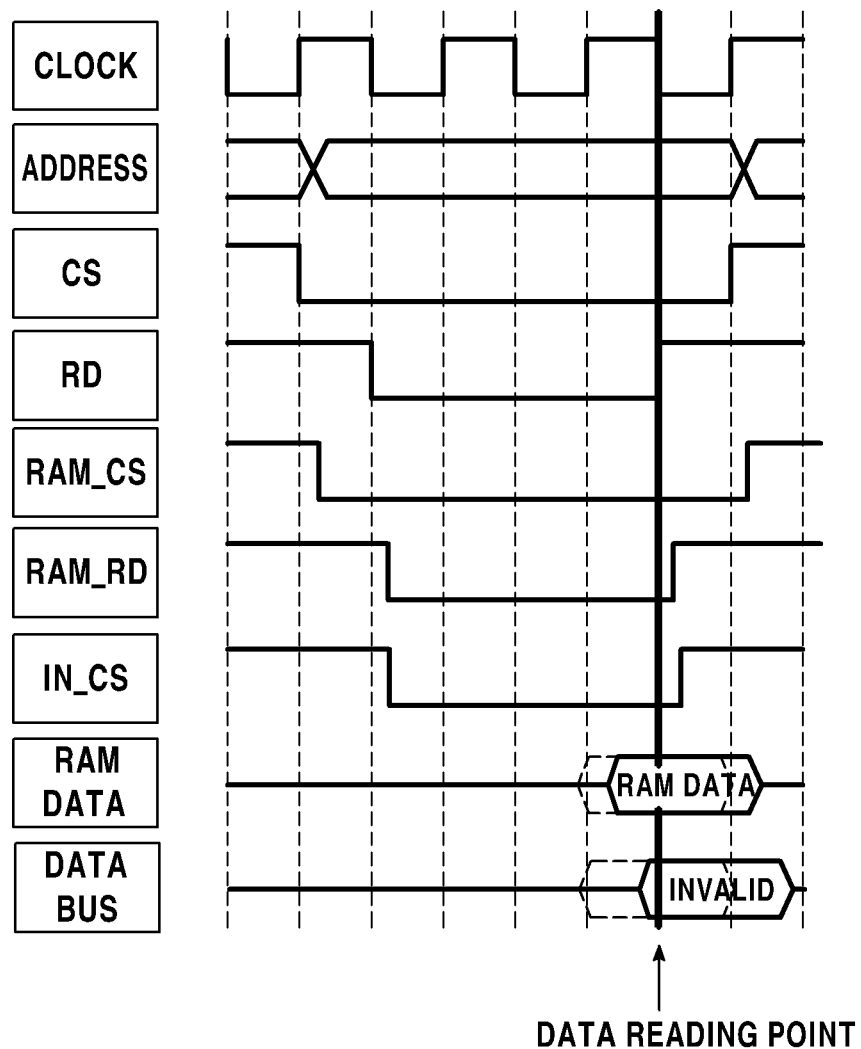
FIG. 5 is a timing diagram during memory read using a level shifter.

FIG. 4 is a dataflow chart during memory read using a level shifter and FIG. 5 is a timing diagram during memory read using a level shifter.

Referring to FIGS. 4 and 5, a read (or reading) process between an MPU and a memory will be explained using a level shifter according to the prior art. Reference numeral 11 in FIG. 4 is an MPU, which is connected to a memory (random access memory (RAM)/read only memory (ROM)) (12) to transmit data to the memory (12), or to receive data from the memory (12).

Thus, although there was a unidirectional communication in FIG. 1 where the MPU (1) receives data from the input sensor (2) and transmits data to the output driver (3), the MPU (11) performs a bidirectional communication with the memory (12) in FIG. 4. Meanwhile, an input buffer (13), an output buffer (14) and two OR gates (15, 16) in FIG. 4 have the same configuration as that of the input buffer (4), the output buffer (5) and the two OR gates (6, 7) in FIG. 1.

In addition, the output buffer (17) in FIG. 4 may be disposed to convert levels of the CS (Chip Select) signal, RD (READ) signal and WR (WRITE) signal outputted from the MPU (11) to levels recognizable by the memory (12). When the MPU (11) reads data from the memory (12), and when the input buffer (13) is enabled using the RD signal because the RD signal is changed to LOW, and effective data (RAM DATA) is loaded on a bus after several clocks, the MPU (11) receives ineffective or invalid data due to delay generated in the course of passing data through the input buffer (13). (See FIG. 5).

In order to overcome the disadvantage thus described, the present disclosure proposes a bidirectional transmission/reception method of reading and writing data between devices having different operating voltages. Particularly, the present disclosure is applicable to data transmission/reception between an MPU and a memory in a PLC each having a different operating voltage, and it should be apparent to those skilled in the art that the present disclosure may be applicable to other fields than the PLC.

Figure 6:
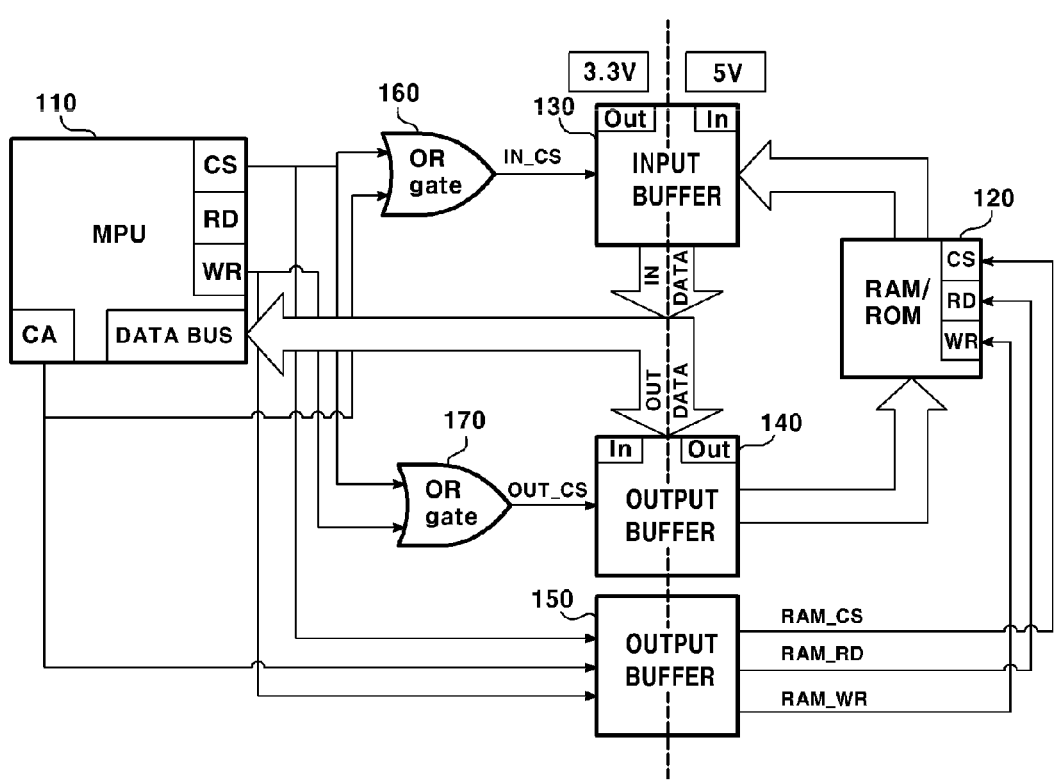
FIG. 6 is a data flowchart during memory read using an address signal according to the present disclosure.
Figure 7:
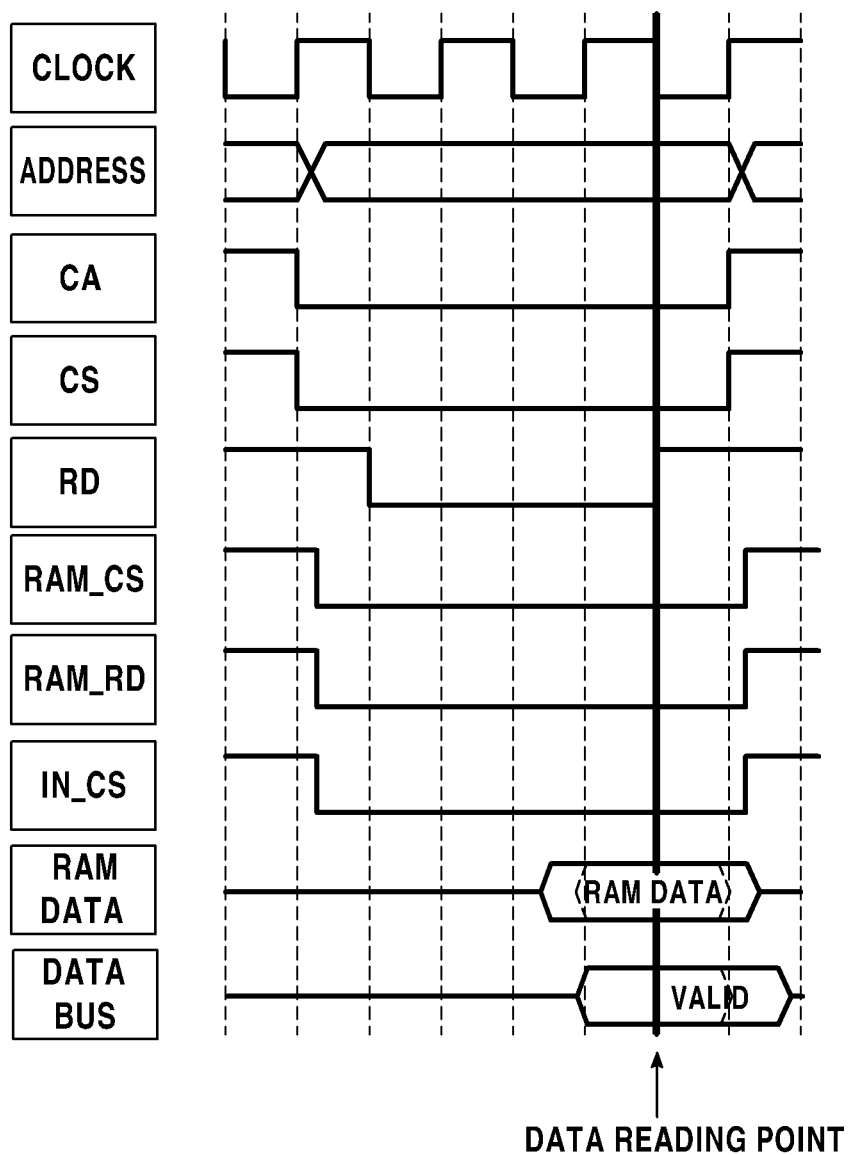
FIG. 7 is a timing diagram during memory read using an address signal according to the present disclosure.

FIG. 6 is a data flowchart during memory read using an address signal according to the present disclosure, and FIG. 7 is a timing diagram during memory read using an address signal according to the present disclosure.

Now, a memory read process will be explained using an address signal according to the present disclosure with reference to FIGS. 6 and 7.

Reference numeral 110 in FIG. 6 is an MPU, which is connected to a memory (RAM/ROM 120) to transmit data to the memory (120), or to receive data from the memory (120). At this time, the operating voltages of the MPU (110) and the memory (120) are different, such that a data input buffer (130) and a data output buffer (140) configured to convert a voltage level of data transmitted and received between the MPU (110) and the memory (120) are interposed between the MPU (110) and the memory (120).

Furthermore, an access signal output buffer (150) may be interposed between the MPU (110) and the memory (120), where the access signal output buffer (150) is configured to convert a voltage level of an access signal for output to the memory (120) in order to allow the MPU (110) to read data, or to write data to the memory (120).

Hereinafter, a signal outputted by the access signal output buffer (150) is defined as a memory access signal.

That is, the data input buffer (130) may receive data from the memory (120) and convert the data to a voltage level of data recognizable by the MPU (110) and output the voltage level to the MPU (110), and the data output buffer (140) may receive the data from the MPU (110), convert the data to a voltage level of data recognizable by the memory (120) and output the voltage level to the memory (120).

Meantime, the access signal output buffer (150) may convert a voltage level of an access signal outputted for the MPU (110) to access the memory (120) to a voltage level recognizable by the memory (120) and output the voltage level to the memory (120).

Meanwhile, a first OR gate (160) may be interposed between the MPU (110) and the data input buffer (130), where the first OR gate (160) may receive a CS (Chip Select) signal and an address signal (CA: Chip Address) outputted from the MPU (110) and output an enable signal (IN_CS) to the data input buffer (130).

Furthermore, a second OR gate (170) may be interposed between the MPU (110) and the data output buffer (140), where the second OR gate (170) may receive a CS (Chip Select) signal and a WR (WRITE) signal outputted from the MPU (110) and output an enable signal (OUT_CS) to the data output buffer (140).

At this time, the MPU (110) may output a level "0" as an address signal in order to read data from the memory (120) and output a level "1" as address signal in order to write data to the memory (120). Thus, when the address signal (CA) outputted from the MPU (110) is level "0", the first OR gate (160) may output a level "0" as an activation signal in order to activate the data input buffer (130). Furthermore, when the address signal (CA) outputted from the MPU (110) is level "1", the first OR gate (160) may output a level "1", whereby the data input buffer (130) is not activated.

For example, when an address area '0x0200 0000~0x02FF FFFF' is divided into read area ('0x0200 0000~0x027F FFFF') and write area ('0x0280 0000~0x02FF FFFF'), and each area is allocated by an uppermost bit of address signal (CA), the uppermost bit is always '0' during reading, and the uppermost bit is always '1' during write.

In case of 16 megabyte (16 MB) memory, an address #23 bit may be used as an input of the first OR gate (130) configured to output an activation signal (IN_CS) for activating the data input buffer (130). For example, when the MPU (110) intends to read data of address 0x1000 in the memory (120), data of the address 0x1000 can be read using address '0x0200 1000'.

As noted from FIG. 7, because the activation signal (IN_CS) is 'LOW' at a time of reading data, the data input buffer (130) is activated, whereby data (RAM DATA) outputted from the memory (120) is extracted as valid data on DATA BUS, and data transmission/reception can be performed without any data loss.

Although the method for transmitting and receiving data between an MPU and a memory in a PLC according to the exemplary embodiments of the present disclosure has been explained, the present disclosure is not limited thereto, and various modifications to the disclosure will be readily apparent to those skilled in the art, and the generic principles defined herein may be applied to other variations without departing from the spirit or scope of the disclosure. Thus, the present disclosure is not intended to limit the examples described herein, but is to be accorded the widest scope consistent with the principles and novel features disclosed herein.

Thus, the above-mentioned method for transmitting and receiving data between an MPU and a memory in a PLC according to the exemplary embodiment of the present disclosure may be embodied in many different forms and should not be construed as limited to the embodiment set forth herein. Thus, it is intended that the exemplary embodiment of the present disclosure may cover the modifications and variations of this disclosure provided they come within the scope of the appended claims and their equivalents.

What is claimed is:

1. A method for transmitting and receiving data between a micro processing unit (MPU) and a memory operating with mutually different operating voltages in a programmable logic controller (PLC), the method comprising:

outputting, by the MPU, a chip select (CS) signal and an address signal to read requested data from the memory;

outputting, by an OR gate, an activation signal for activating a data input buffer, the OR gate receiving the CS signal and the address signal output by the MPU;

outputting, by an access signal output buffer, a memory access signal for operation of the memory, the access signal output buffer receiving the CS signal and the address signal output by the MPU;

outputting, by the memory, the requested data to the data input buffer in response to the memory access signal; and outputting, by the data input buffer, the requested data to the MPU when the requested data is received by the data input buffer from the memory.

2. The method of claim 1, wherein outputting the memory access signal includes outputting, by the access signal output buffer, the memory access signal by converting the CS signal and the address signal received from the MPU to a voltage level recognizable by the memory.

3. The method of claim 1, wherein outputting, by the data input buffer, the requested data to the MPU includes outputting the requested data received by the data input buffer to the MPU by converting the requested data received by the data input buffer to a voltage level recognizable by the MPU.

4. The method of claim 1, wherein the address signal is level shifted at the same time as the CS signal.

5. The method of claim 1, wherein the CS signal and the address signal maintain a level "LOW" to enable the OR gate to output the activation signal while the requested data is being output to the data input buffer by the memory and the requested data is being output to the MPU by the data input buffer.

6. The method of claim 1, wherein an uppermost bit of the address signal sets a read area and a write area of the memory configured by dividing a memory area in half.

* * * * *